United States Patent [19]

Shen et al.

[11] Patent Number: 4,978,634

[45] Date of Patent: Dec. 18, 1990

[54] METHOD OF MAKING TRENCH DRAM CELL WITH STACKED CAPACITOR AND BURIED LATERAL CONTACT

[75] Inventors: Bing-Whey Shen, Richardson; Masaaki Yashiro; Randy McKee, both of Plano; Gishi Chung; Kiyoshi Shirai, both of Dallas; Clarence Teng; Donald J. Coleman, Jr., both of Plano, all of Tex.

[73] Assignee: Texas Instruments, Incorporated, Dallas, Tex.

[21] Appl. No.: 385,327

[22] Filed: Jul. 25, 1989

[51] Int. Cl.$^5$ .......................................... H01L 21/265
[52] U.S. Cl. ........................................ 437/52; 437/38; 437/47; 437/60; 437/162; 437/203; 437/228; 437/919; 357/23.6
[58] Field of Search ...................... 437/38, 47, 52, 60, 437/160, 162, 203, 228, 919; 357/23.6, 51; 365/188

[56] References Cited

U.S. PATENT DOCUMENTS

| | | | |
|---|---|---|---|
| 4,225,945 | 9/1980 | Kuo ..................................... | 365/149 |
| 4,327,476 | 5/1982 | Iwai et al. ........................... | 437/203 |
| 4,353,086 | 10/1982 | Jaccodine ............................. | 357/51 |
| 4,397,075 | 8/1983 | Fatula, Jr. et al. ................... | 437/52 |
| 4,717,942 | 1/1988 | Nakamura et al. .................. | 357/23.6 |
| 4,791,463 | 12/1988 | Malhi ................................. | 357/23.6 |
| 4,797,373 | 1/1989 | Malhi et al. .......................... | 437/60 |
| 4,830,978 | 5/1989 | Teng et al. ........................... | 437/162 |

FOREIGN PATENT DOCUMENTS

| | | |
|---|---|---|
| 88451 | 3/1983 | European Pat. Off. . |
| 108390 | 5/1984 | European Pat. Off. . |
| 118878 | 9/1984 | European Pat. Off. . |
| 167764 | 1/1986 | European Pat. Off. . |
| 3508996 | 10/1985 | Fed. Rep. of Germany . |
| 130178 | 12/1976 | Japan . |
| 5511365 | 1/1980 | Japan . |
| 103373 | 6/1984 | Japan . |
| 6012752 | 1/1985 | Japan . |
| 213053 | 10/1985 | Japan . |
| 6136965 | 2/1986 | Japan . |
| 2168195 | 12/1985 | United Kingdom . |

OTHER PUBLICATIONS

Nakajima et al., "An Isolation–Merged Vertical Capacitor Cell for Large Capacity DRAM", IEDM 1984, pp. 240-243.

Primary Examiner—Brian E. Hearn
Assistant Examiner—T. Thomas
Attorney, Agent, or Firm—Melvin Sharp; Jim Comfort; Stanton C. Braden

[57] ABSTRACT

The described embodiments of the present invention provide DRAM cells, structures and manufaturing methods. In a first embodiment, a DRAM cell with a trench capacitor having a first plate formed as a diffusion on the outside surface of a trench formed in the substrate and a second plate having a conductive region formed inside the trench is fabricated. The transfer transistor is formed using a field plate isolation structure which includes a self-aligned moat area for the transfer transistor. The moat area slightly overlaps the capacitor area and allows for increased misalignment tolerance thus foregoing the requirement for misalignment tolerances built into the layout of the DRAM cell. The field plate itself is etched so that it has sloped sidewalls to avoid the formation of conductive filaments from subsequent conductive layers formed on the integrated circuit. The use of a self-aligned bitline contact between two memory cells allows for the elimination of alignment tolerances between the bitline contact and the gates of the transfer transistors of the memory cells.

5 Claims, 20 Drawing Sheets

METHOD OF MAKING TRENCH DRAM CELL WITH STACKED CAPACITOR AND BURIED LATERAL CONTACT

FIELD OF THE INVENTION

The present invention relates to the field of integrated circuit design and fabrication. More specifically, the present invention relates to the field of dynamic random access memory arrays, cells and other structures and the methods for fabricating those structures.

BACKGROUND OF THE INVENTION

The quest to develop smaller and smaller dynamic random access memory (DRAM) cells and related structures is a well-known goal. In integrated circuit manufacturing, certain costs are relatively fixed no matter what integrated circuit is fabricated. Thus, the greater density of memory on a single integrated circuit provides greater economy on a per bit basis by spreading these fixed costs across more memory capacity. In addition, greater memory storage capacity allows greater memory capacity of the end user products, such as computers, in a smaller package. Therefore, the value to the customer is increased. Because 50% or more of the area of a DRAM is used for memory cells themselves, reduction of the memory cell size allows for far greater numbers of those memory cells to be placed on the DRAM.

Several techniques have been developed to try to reduce the size of memory cells. For example, the fundamental dynamic random access memory cell has been reduced to a minimum of components, i.e. a transistor and a capacitor connected to the source of the transistor. The transistor allows access to the charge stored on the capacitor and the stored charge represents data. The first step in reducing the size of DRAM cells was the effective integration of the transfer transistor and the capacitor. An example of this is found in Kuo, "Random Access Memory Cell with Different Capacitor and Transistor Oxide Thickness", U.S. Pat. No. 4,240,092, issued Dec. 16, 1980 and assigned to the assignee of this application. Kuo is an example of a "Hy-C" cell. As the density of DRAMs increased, limitations of the Hy-C cell became apparent. In order to provide accurate data storage and retrieval, the capacitance of the storage capacitor must be as large as possible. However, the capacitance of the storage capacitor is directly proportional to the area between the plates of the capacitor. In a planar capacitor cell, like the Hy-C cell, this creates a fundamental tradeoff between cell size and cell capacitance.

In order to minimize the surface area occupied by the memory cell while maintaining adequate storage capacitor capacitance, vertical capacitor structures were developed. An example of such a structure is found in Sunami, "Cell Structures for Featured DRAMs", International Electron Devices Meeting Technical Digest (1985), Paper 29.1, pages 694–697. In some cases, the capacitor is formed on a trench etched into the surface of the substrate. An example of this can be found in Ishiuchi, et al., "Submicron CMOS Technologies for 4 Megabit Dynamic RAM", International Electron Devices Meeting Technical Digest (1985), Paper 29.4, pages 706–709. In other cases, a stacked or multiple plate concept providing a vertically stacked capacitor was investigated. An example of this can be found in Sunami, et al., supra.

The difficulties of forming the storage capacitor in a trench have introduced a great deal of complexity into the fabrication of the DRAM cells. For example, see Baglee, et al., U.S. Pat. No. 4,721,987, "Trench Capacitor Process for High Density Dynamic RAM", issued Jan. 26, 1988 and assigned to the assignee of this application. Although the storage capacitor itself has been made smaller, the additional difficulties in connecting the transfer transistor to the capacitor have introduced requirements for spacing tolerances and increased complexity in leakage components. These have all necessitated complex processing steps and additional area occupied to fabricate the DRAM cells.

SUMMARY OF THE INVENTION

The described embodiments of the present invention provide DRAM cells, structures and manufacturing methods. In a first embodiment, a DRAM cell with a trench capacitor having a first plate formed as a diffusion on the outside surface of a trench formed in the substrate and a second plate having a conductive region formed inside the trench is fabricated. The transfer transistor is formed using a field plate isolation structure which includes a self-aligned moat area for the transfer transistor. The moat area slightly overlaps the capacitor area and allows for increased misalignment tolerance thus foregoing the requirement for misalignment tolerances built into the layout of the DRAM cell. The field plate itself is etched so that it has sloped sidewalls to avoid the formation of conductive filaments from subsequent conductive layers formed on the integrated circuit. The use of a self-aligned bitline contact between two memory cells allows for the elimination of alignment tolerances between the bitline contact and the gates of the transfer transistors of the memory cells.

In another embodiment of the present invention, a planar capacitor is used with a field plate isolation scheme including a transfer transistor moat region self-aligned to the field plate. This structure allows the elimination of alignment tolerances between the capacitor and the transistor thus reducing the space necessary between the transistor and the capacitor. In addition, self-aligned techniques between the bitline and the drain of two adjacent transfer transistors allows for the elimination of many alignment tolerances between the bitline contact and the transfer transistors.

In another embodiment of the present invention, a memory cell using two conductive plates formed inside a trench as the storage capacitor is fabricated. A field plate isolation scheme which allows for self-alignment of the moat containing the transfer transistor is used thus allowing for self-alignment of the moat and elimination of alignment tolerances between the moat region and the source drain diffusions. In addition, sloped sidewalls on the field plate are used to avoid the fabrication of conductive filaments formed when depositing conductive layers subsequent to the field plate. A self-alignment technique between the transfer transistor and the capacitor is used in order to eliminate many alignment tolerances between the transfer transistor and the storage capacitor. A self-aligned bitline contact technique is used between two adjacent transfer transistors, thus allowing the elimination of many alignment tolerances between the bitline contact and the transfer transistors.

In addition, a sidewall insulator technique using two different materials, which may be selectively etched between one another, is used to provide a less destructive fabrication technique for forming sidewall insulating layers and allowing the use of gate insulator layer to protect the surface of the substrate during the formation of the sidewall insulating layers.

DESCRIPTION OF THE DRAWINGS

The present invention is best understood with regard to the following described embodiments read in conjunction with the drawings provided herewith wherein:

FIG. 3I is a plan view schematic diagram;

DETAILED DESCRIPTION

Figure 1:
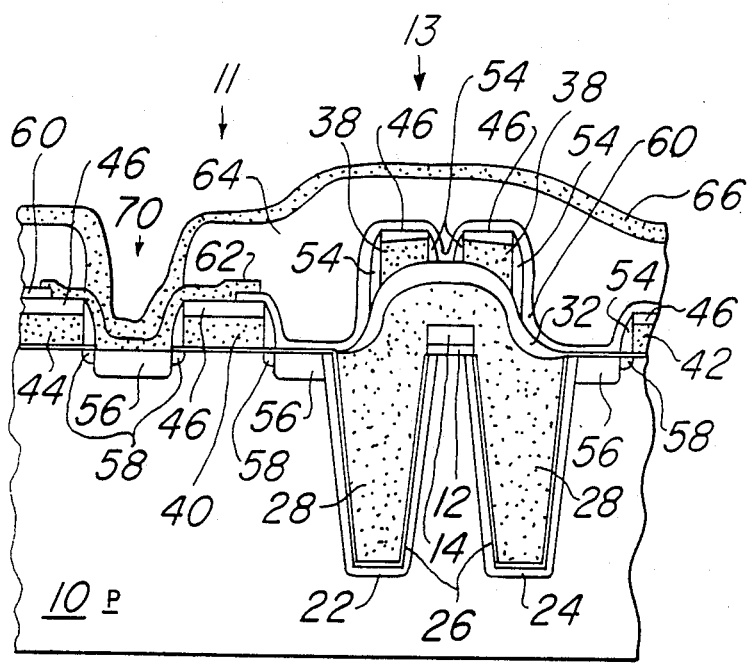
FIG. 1 is a side view schematic diagram of a dynamic random access memory cell which is one embodiment of the present invention.
Figure 2:
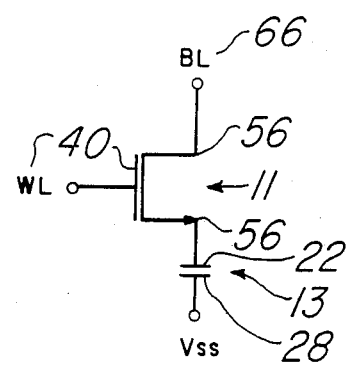
FIG. 2 is an electrical schematic diagram showing the electrical operation of the DRAM cell shown in FIG. 1.
Figure 3A:
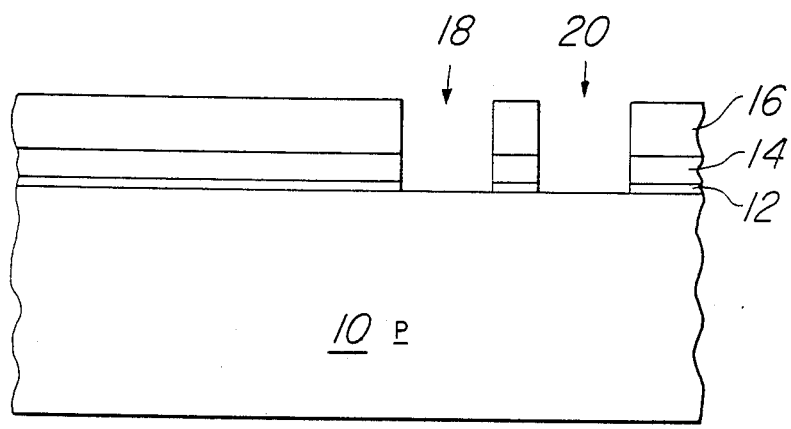
FIGS. 3A through 3M are schematic diagrams showing the processing steps necessary to fabricate the DRAM cell shown in FIG. 1, where all but FIG. 3I are side view schematic diagrams
Figure 4:
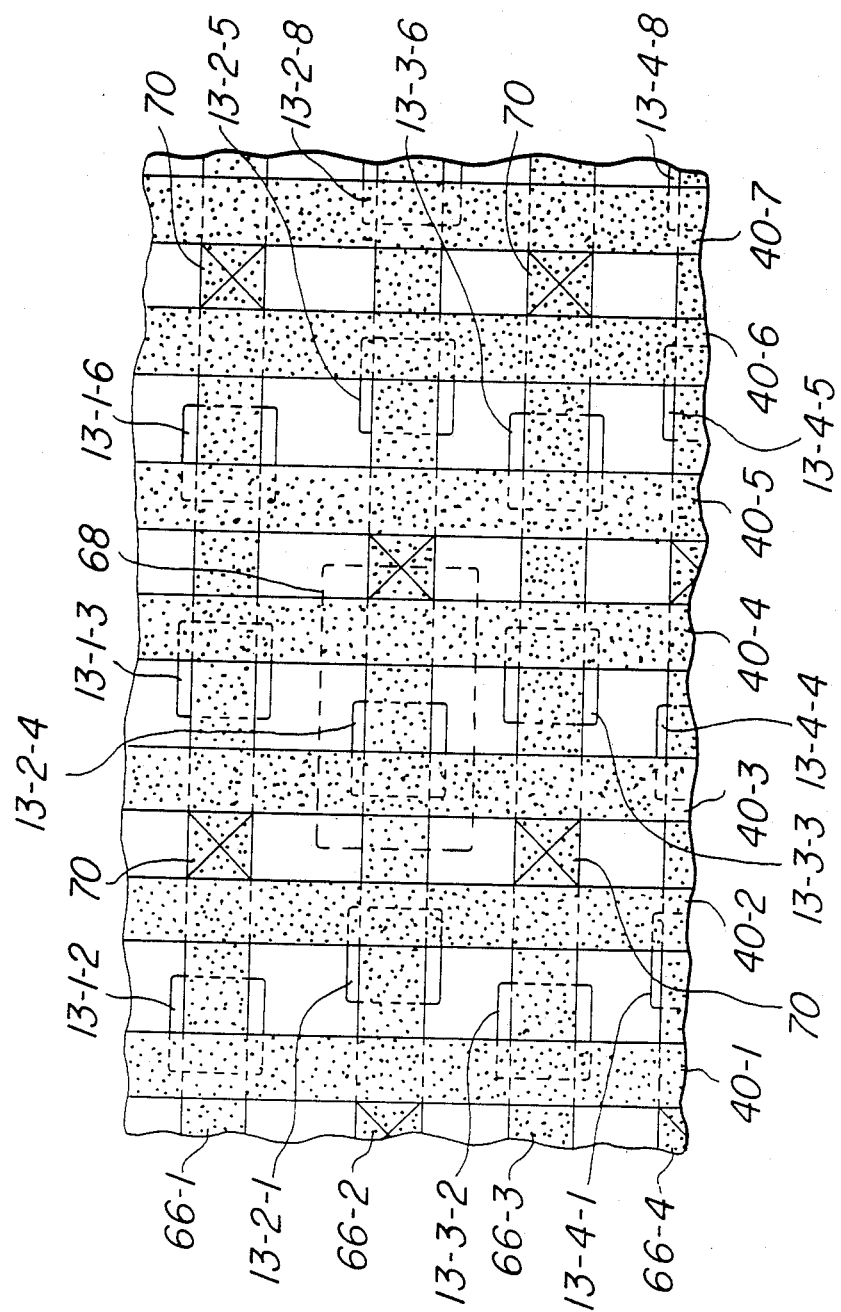
FIG. 4 is a schematic plan view diagram of a memory array including the DRAM cell described with regard to FIG. 1.
Figure 5:
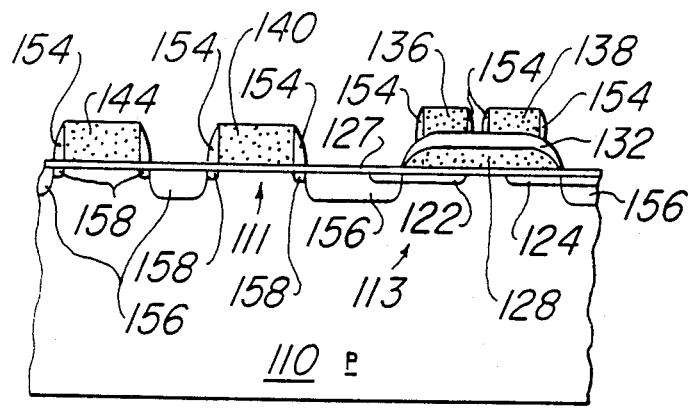
FIG. 5 is a side view schematic diagram of a DRAM cell with a planar storage capacitor which is one embodiment of the present invention.
Figure 6:
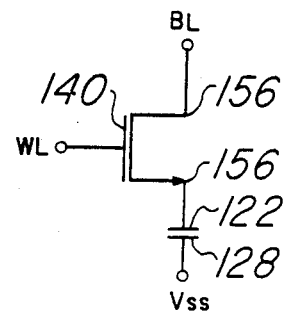
FIG. 6 is an electrical schematic diagram showing the electrical characteristics of the DRAM cell shown in FIG. 5.
Figure 7:
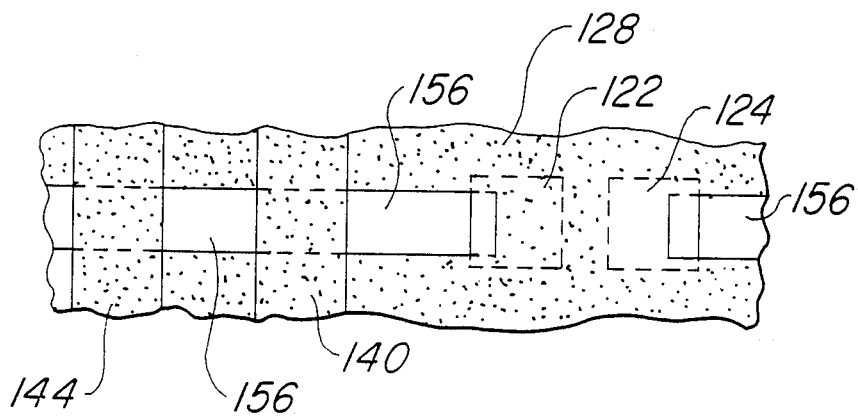
FIG. 7 is a plan view diagram showing the layout of the cell shown in FIG. 5.
Figure 8:
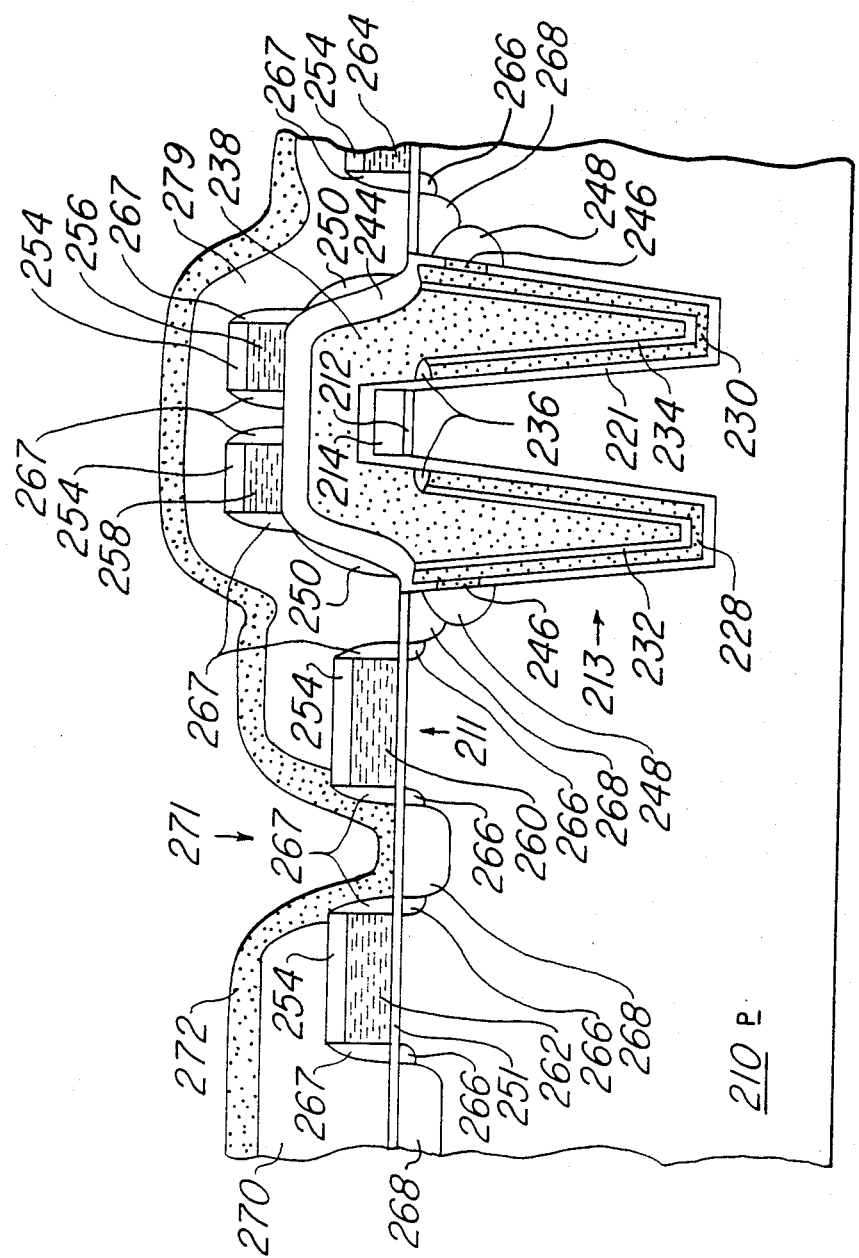
FIG. 8 is a side view schematic diagram showing another embodiment of the present invention.
Figure 9:
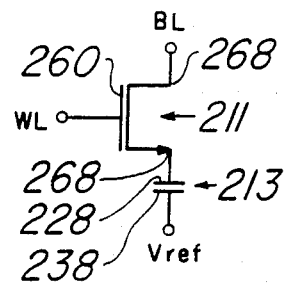
FIG. 9 is an electrical schematic diagram showing the electrical operation of the embodiment shown in FIG. 8.
Figure 10A:
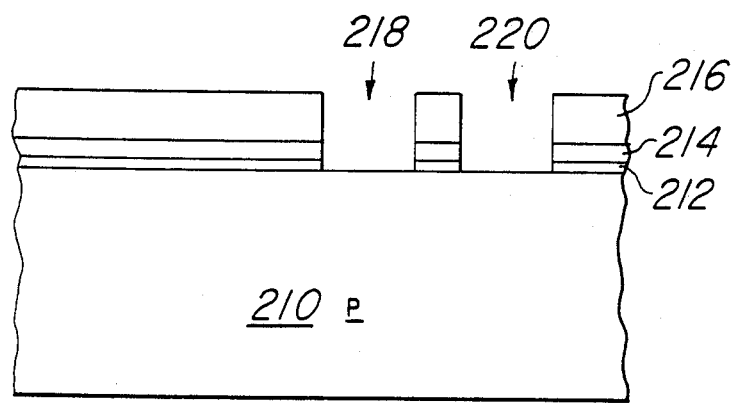
FIGS. 10A through 10Q are schematic diagrams showing processing steps for fabricating the embodiment shown in FIG. 8 where all but FIG. 10O are side view schematic diagrams and FIG. 10O is a plan view schematic diagram.
Figure 11:
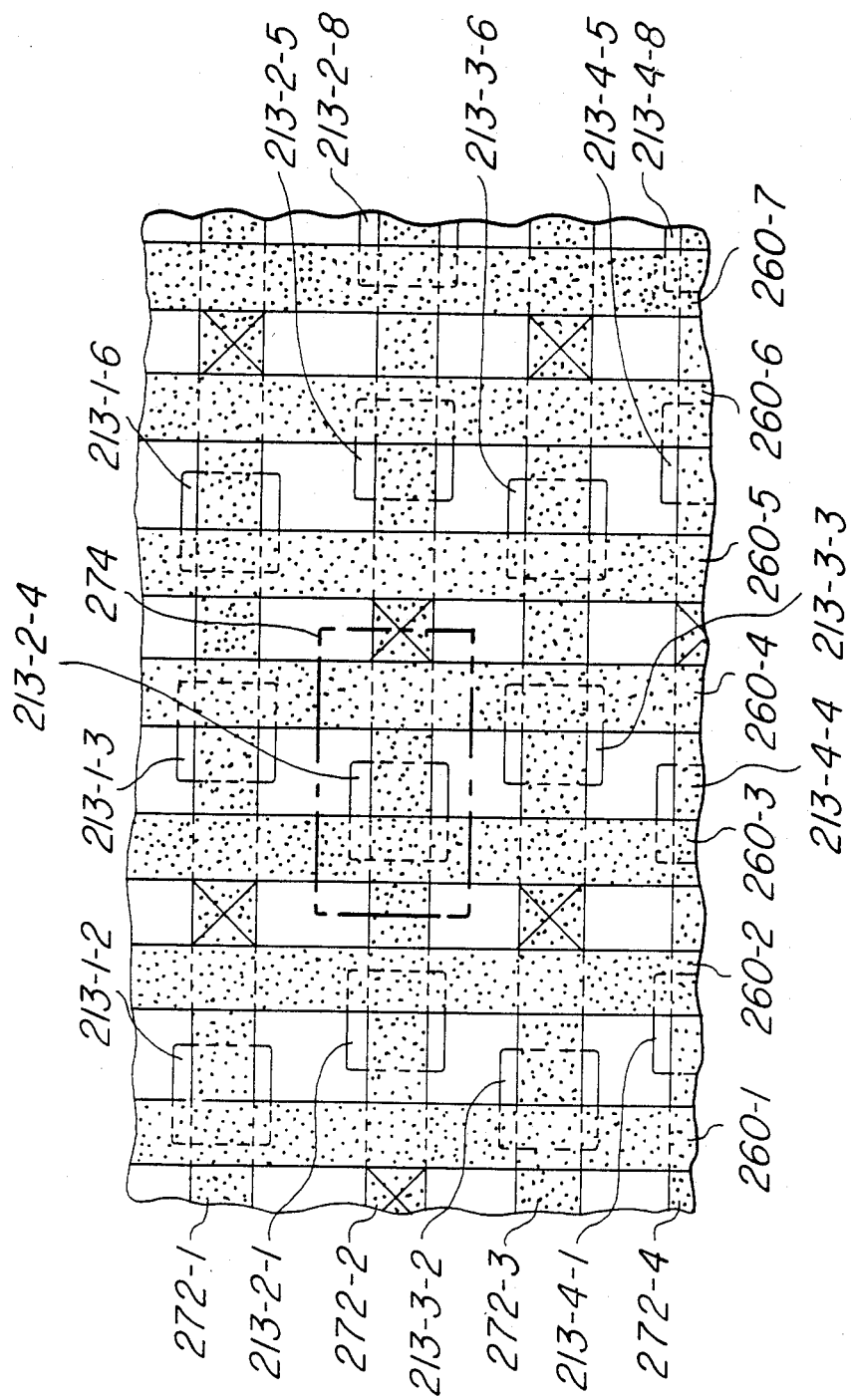
FIG. 11 is a plan view diagram of an array of memory cells such as the embodiment shown in FIG. 8.

FIG. 1 is a side view schematic diagram showing one embodiment of the present invention which is a DRAM cell. FIG. 2 is an electrical schematic diagram showing the electrical operation of components of the embodiment shown in FIG. 1, with correspondingly numbered components in FIG. 2 corresponding to those components in FIG. 1. FIGS. 3A through 3M are schematic diagrams showing the processing steps for fabricating the embodiment shown in FIG. 1. FIG. 4 is a memory array including the memory cell shown in FIG. 1. FIG. 5 is a side view schematic diagram of another embodiment of the present invention using simplified manufacturing steps as explained with regard to FIGS. 3A through 3M but including a planar capacitor. FIG. 6 is an electrical schematic diagram showing the electrical operation of the embodiment shown in FIG. 5. FIG. 7 is a plan view diagram showing the layout of components of the embodiment shown in FIG. 5. FIG. 8 is a side view schematic diagram of another embodiment of the present invention including a stacked capacitor comprising two plates formed in a trench. FIG. 9 is an electrical schematic diagram showing the operation of the embodiment of FIG. 8. FIGS. 10A through 10Q are schematic diagrams showing the processing steps for fabricating the embodiment shown in FIG. 8. FIG. 11 is a plan view diagram showing the layout of a memory array including the embodiment of FIG. 8.

FIG. 1 is a side view schematic diagram of one embodiment of the present invention. The memory cell of FIG. 1 consists of a transfer transistor 11 and a storage capacitor 13. When data is to be stored on the memory cell, the data is placed on bitline 66 and a high voltage signal (approximately 3.3 volts) is placed on gate 40. Thus, the voltage placed on bitline 66 is passed through via source 56 to storage node 22. Capacitor 13 is comprised of storage diffusion 22 in capacitive coupling with field plate 28. Field plate 28 is tied to a reference potential and thus a charge representing the voltage applied by bitline 66 is stored on storage diffusion 22. To store the data on storage diffusion 22, the positive voltage is removed from gate 40 thus stopping continuity between source/drain regions 56. Gate 40 is part of a word line extending perpendicular to the page of FIG. 1. Gate 44 controls access to a storage capacitor off to the left hand side of the page. Wordlines 36 and 38 pass over field plate 28 to provide control for memory cells extending perpendicularly into the page and out from the page. Partial wordline 42 controls access to the capacitor formed by field plate 28 and storage diffusion 24.

FIG. 2 is an electrical schematic diagram showing the electrical operation of transfer transistor 11 in capacitor 13 of FIG. 1. The reference numerals of FIG. 2 correspond to the reference numerals of FIG. 1 and indicate the electrical functions of the reference components.

FIGS. 3A through 3M are schematic diagrams showing the processing steps for forming the embodiment shown in FIG. 1. P substrate 10 is a crystalline silicon substrate doped to a P-type conductivity of approximately 0.9 ohms-centimeters. P substrate 10 may be a complete substrate of 0.9 per ohm centimeter material or a 0.9 ohm centimeter epitaxial layer may be formed on the surface of a substrate having a differing doping type or concentration. Silicon dioxide layer 12 is formed by thermal oxidation of P substrate 10 to a thickness of approximately 350 Angstroms by thermal oxidation in an oxygen ambient in approximately 950° C. for approximately 50 minutes. Silicon nitride layer 10 is formed by low pressure chemical vapor deposition to a thickness of approximately 1000 Angstroms. A hardmask 16 is formed to a thickness of approximately 5000 Angstroms by chemical vapor deposition of phosphorous doped silicon dioxide. A layer of photoresist (not shown) is then patterned and silicon dioxide layer 12, silicon nitride layer 14 and silicon dioxide layer 16 are etched to provide openings 18 and 20 as shown in FIG. 3A.

Figure 3B:
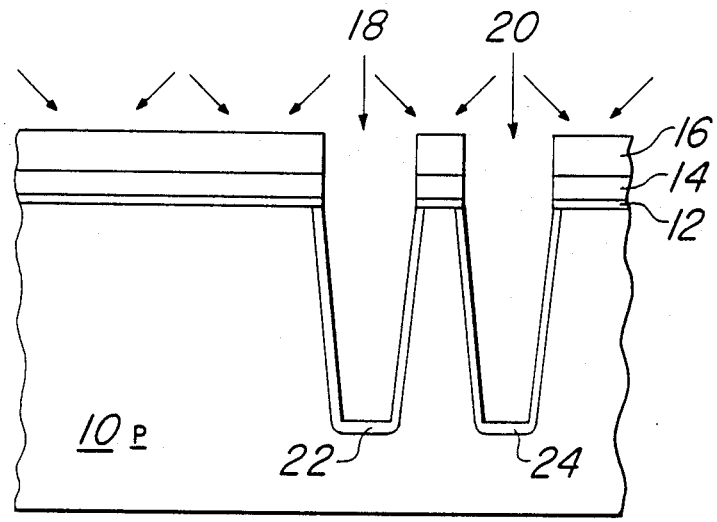

Using silicon dioxide layer 16 as a mask, trenches 18 and 20 are etched into the surface of substrate 10 as shown in FIG. 3B. A suitable etching method can be found in Douglas, "Trench Etch Process for a Single-Wafer RIE Dry Etch Reactor", U.S. Pat. No. 4,784,720, issued Nov. 15, 1988 and assigned to the assignee of this application. The walls of trenches 18 and 20 are then doped using arsenic to a doping concentration of approximately $3 \times 10^{19}$ dopant atoms per centimeter$_3$ using one of many processes. For example, an angled ion implantation with arsenic ions at an angle of 8° while rotating substrate 10 may be performed. The ions are implanted at an energy of approximately 100 kiloelectron volts in a density of approximately $5 \times 10^{15}$ ions per centimeter$^2$. Other suitable doping techniques such as deposition of doped materials and diffusion of the dopants into substrate 10 may suitable be used.

Figure 3C:
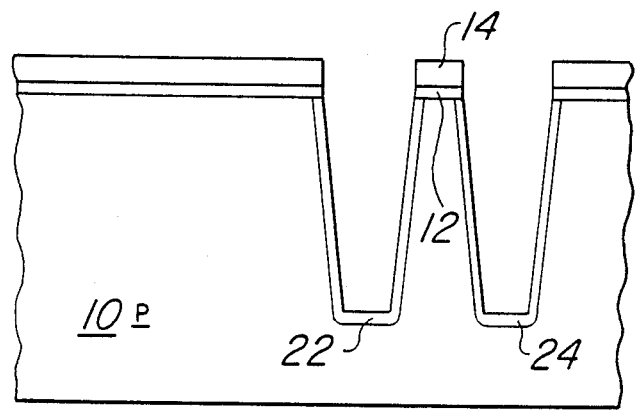
Figure 3D:
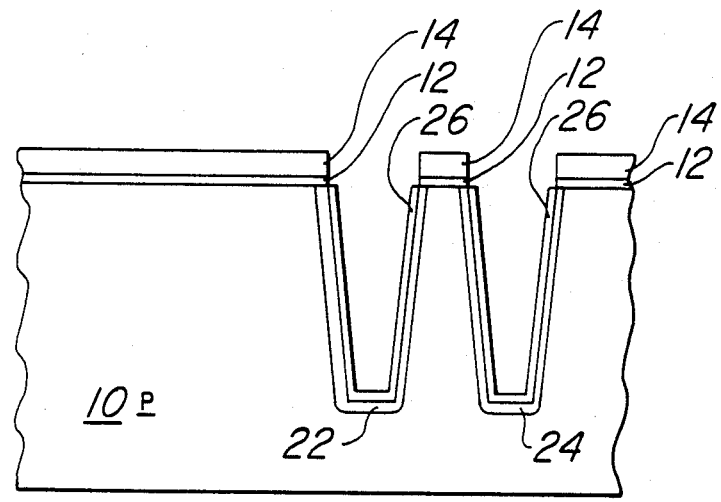

Silicon dioxide layer 16 is then removed using wet etching in a 10% buffered hydrofluoric acid solution for approximately 40 seconds. The resulting structure is shown in FIG. 3C.

Figure 3E:
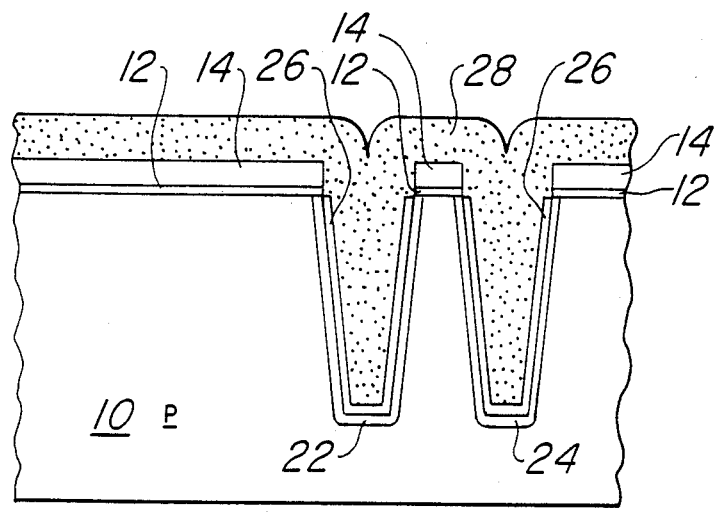
Figure 3F:
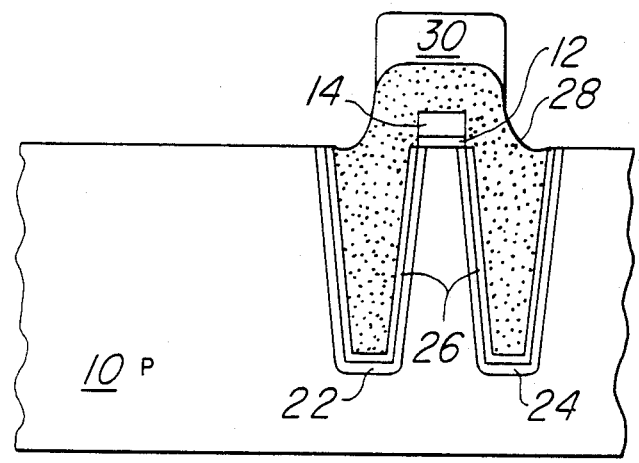

A suitable capacitor dielectric 26 such as thermally grown silicon dioxide is then formed to a thickness of approximately 60 Angstroms using thermal oxidation in an oxygen ambient for approximately 40 minutes at a temperature of approximately 850° C. Other suitable dielectrics include silicon dioxide, silicon nitride, silicon dioxide stacks, oxidized silicon nitride and other deposited materials such as tantalum oxide. A layer of polycrystalline silicon 28 is then deposited by low pressure chemical vapor deposition of silane to a thickness of approximately 5000 Angstroms. The resulting structure is shown in FIG. 3E. Polycrystalline silicon layer 28 is doped by in situ doping to provide a conductivity of approximately 0.005 ohm-centimeters. Polycrystalline silicon layer 28 may then be thinned on the surface to a thickness of approximately 2,000 Angstroms using wet etching or plasma etching in a carbon tetraflouride plasma. This reduces the topology of polycrystalline silicon layer 28. Polycrystalline silicon layer 28 provides a field plate which covers all areas of the array excepting where the transfer transistors are to be formed. Field plate 28 provides an implantation mask for formation of those transistors thus providing a self-aligned system for aligning field plate 28 and the transfer transistors. This provides a greater packing density because no alignment tolerance is required between the transfer transistors and the field isolation device. A layer of photoresist 30 is formed on the surface of field plate 28 and field plate 28 is etched using a combination isotropic and anisotropic process. An anisotropic etch is used such as hydrofluoric/bromic acid for approximately 1 minute. An isotropic etch is then performed to provide sloped sidewalls to leave the structure as shown in FIG. 3F.

Figure 3G:
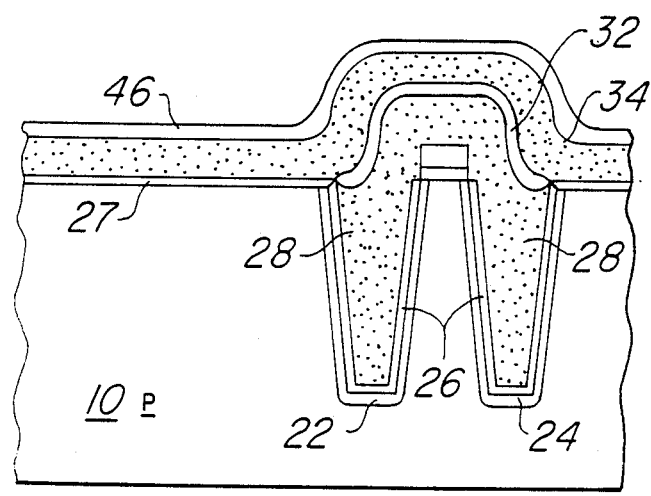

Photoresist layer 30 is then removed using standard photoresist removal processes such as wet removal or ashing. Silicon nitride layer 14 and silicon dioxide layer 12 are then removed by etching in a plasma of $C_2F_6/CHF_3$. The structure of FIG. 3F with photoresist layer 30 thus removed is then subjected to an oxidation step in a oxygen/steam ambient for approximately 30 minutes to form silicon dioxide layers 27 and 32 as shown in FIG. 3G. Because of the higher rate of oxidation of polycrystalline silicon layer 28, silicon dioxide layer 32 is much thicker than silicon dioxide layer 27. The use of an overall oxidation step provides a contiguous isolation layer from the moat surface of substrate 10 to field plate 28. Thus complete sealing of field plate 28 from subsequent conductive layers is achieved. In another embodiment, the surface of the moat is protected by silicon nitride layer 14 and silicon dioxide layer 12 while polycrystalline silicon layer 28 is oxidized. Silicon dioxide layer 27 is then formed in a separate oxidation step. A polycrystalline silicon layer 34 and a silicon dioxide layer 46 are then deposited on the surface of the structure of FIG. 3G as shown in FIG. 3G. Polycrystalline silicon layer is approximately 2500 Angstroms thick. Silicon dioxide layer 46 is approximately 1,000 Angstroms thick. Polycrystalline silicon layer 34 has a conductivity of approximately 0.005 ohms-centimeter.

Figure 3H:
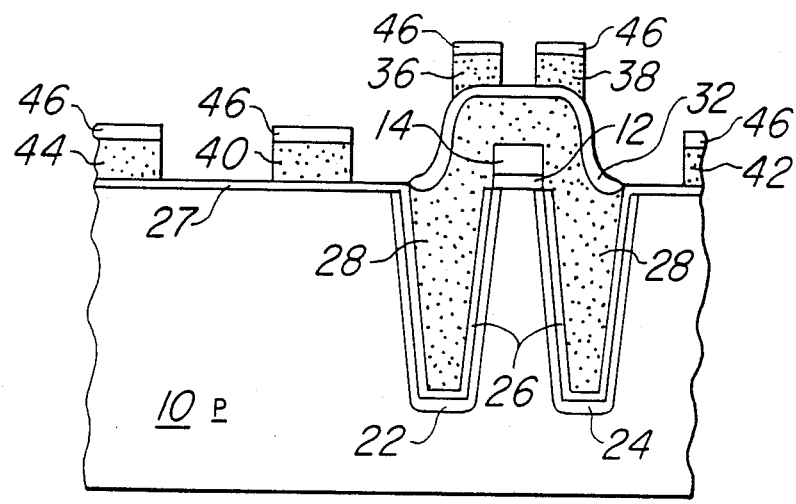

Polycrystalline silicon layer 34 and silicon dioxide layer 46 are then patterned and etched to provide wordlines 36, 38, 40, 42 and 44 as shown in FIG. 3H.

Figure 3I:
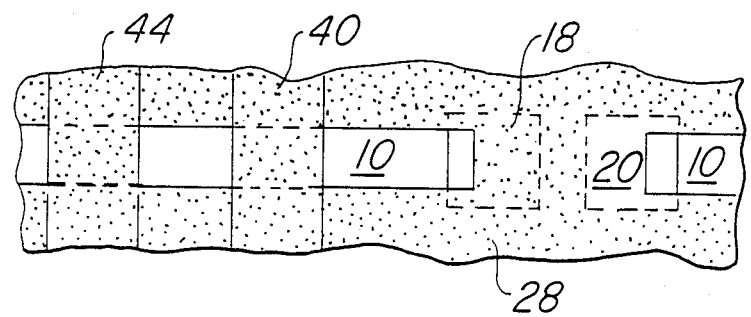

FIG. 3I is a plan view of a portion of the structure of FIG. 3H. As can be seen from FIG. 3I, exposed moat regions of substrate 10 (covered by silicon dioxide layer 27) are left where field plate 28 and wordlines 40 and 44 do not cover substrate 10. Field plate 28 and the wordlines provide an implantation mask for the formation of source drains which provides an automatic alignment between the gates provided by the wordlines 40 and 44, and field plate 28. Because of this automatic alignment, no additional alignment tolerance is required to form the source/drains of the transfer transistor 11 (FIG. 1) and an additional masking step its potential for yield loss is avoided. The capacitor structures in FIG. 3I are indicated by trenches 18 and 20 although, of course, the capacitors are actually the more complex structures shown in FIG. 3H.

Figure 3J:
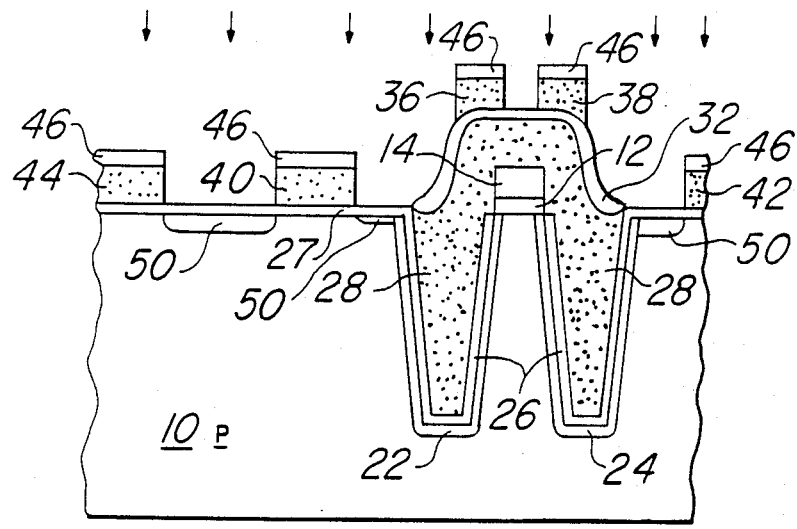
Figure 3K:
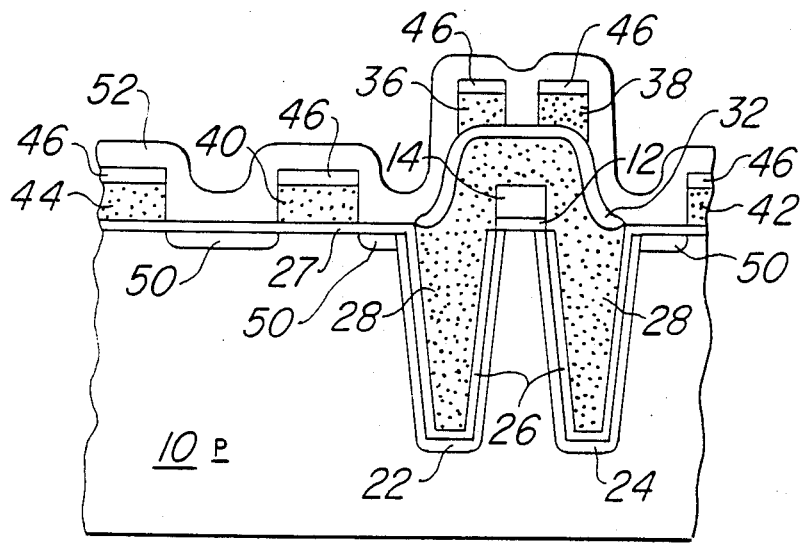
Figure 3L:
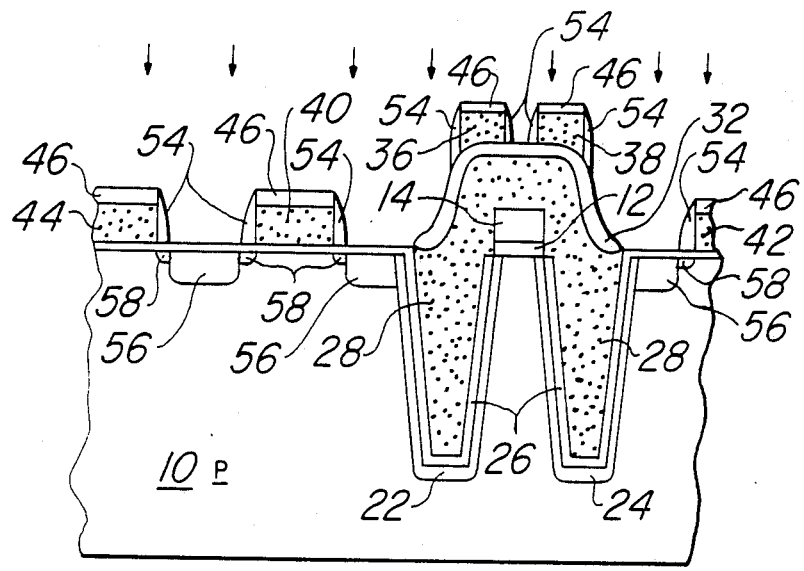
Figure 3M:
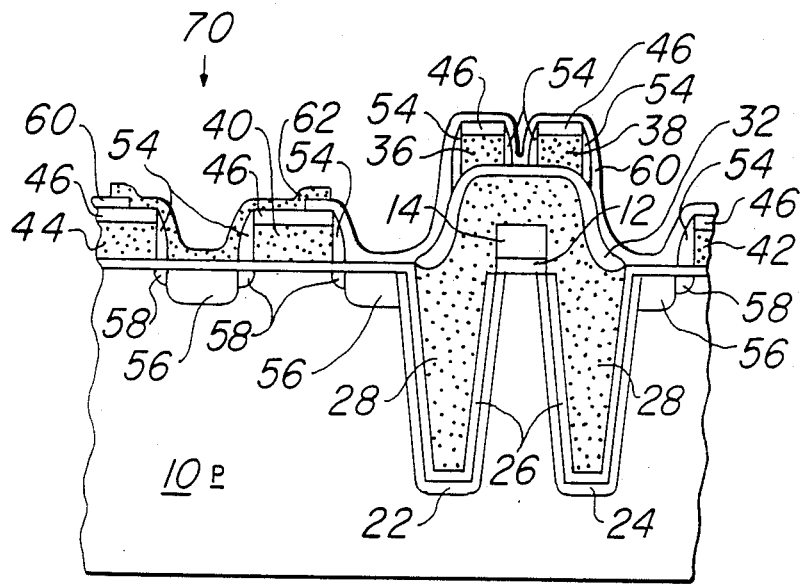

The structure of FIG. 3H is subjected to an ion implantation of phosphorous ions having an energy of approximately 60 kiloelectron volts and a density of approximately $4 \times 10^{13}$ ions per centimeter$^2$ to form lightly doped source/drain regions 50 as shown in FIG. 3J. A layer of silicon nitride 52 is then deposited by low pressure chemical vapor deposition to a thickness of approximately 1000 Angstroms on the structure of FIG. 3J as shown in FIG. 3K. Silicon nitride layer 52 is then etched anisotropically using a sulphur hexafluoride etchant in reactive ion etching to provide sidewall nitride layers 54 as shown in FIG. 3L. Because the reactive ion etching step which formed sidewall nitride layers 54 is selective to silicon dioxide, silicon dioxide layers 46 and 26 protect wordlines 36, 38, 40, 42 and 44 and substrate 10, respectively. Prevention of this damage caused by ion bombardment protects the conductivity of the word lines and the source/drain regions formed in substrate 10.

The structure of FIG. 3L is subjected to ion implantation of arsenic ions having an energy of approximately 100 kiloelectron volts and a density of approximately $3 \times 10^{15}$ ions per centimeter$^2$ to form source/drain regions 56 as shown in FIG. 3L. The remaining portions of lightly doped source/drain regions 50 (FIG. 3K) provide lightly doped drain regions 58 as shown in FIG. 3L. Lightly doped drain regions 58 reduce the field density at the edges of transfer transistor 11 thus reducing the incidence of hot electrons in the operation of transistor 11 and increasing the lifetime of transistor 11. In another embodiment, source/drain regions 50 may be omitted. Because of the close spacing of DRAM cells, the high conductivity of source/drain 50 is not cricital, therefore, they may be omitted.

Silicon dioxide layer 60 is formed cy chemical vapor deposition to a thickness of approximately 200 Angstroms. A photoresist pattern (not shown) is then formed on the surface of the structure of FIG. 3M to provide an opening for bitline contact to source/drain region 56 between gates 40 and 44. Silicon dioxide layer 60 is then subjected to reactive ion etching using an etchant selective to silicon dioxide such as carbon tetraflouride to provide opening 70. This opening is used for the deposition of thin polycrystalline silicon layer 62 which has a thickness of approximately 300 Angstroms and a conductivity of approximately 0.005 ohm-centimeters. Polycrystalline silicon layer 62 is then patterned using common lithographic techniques to provide the structures shown in FIG. 3M. Polycrystalline silicon layer 62 provides a "landing pad" for deposition of bitline 66. Because polycrystalline silicon layer 62 extends up onto silicon dioxide layer 60, a much larger alignment tolerance area for positioning of the contact to source/drain 56 is available.

Boron-phosphorous doped silicon dioxide layer 64 is deposited to a thickness of approximately 5,000 Angstroms on the surface of the structure of FIG. 1. A photoresist pattern (not shown) is then formed to allow the formation of opening 70 as shown in FIG. 1. Silicon dioxide layer 64 is then etched using an etchant such as carbon tetraflouride which is selective to silicon dioxide to provide an opening to the top surface of polycrystalline silicon layer 62. Because polycrystalline silicon layer 62 extends up wider than the opening between wordlines 40 and 44, no alignment tolerance between wordlines 44 and 40 is necessary thus the distance between wordlines 40 and 44 may be the minimum lithography dimension allowed by the lithography system used. Bitline 66 is then deposited on the surface of silicon dioxide 64. Of course, standard via formation may be used to contact diffusion 56, but this increases the array size. Bitline 66 may be any suitable conductive material such as polycrystalline silicon, tungsten, titanium tungsten or others. In the embodiment where diffusion 56 is omitted, a highly doped contact region is formed in the contact by diffusion of dopants from polycrystalline silicon layer 62.

FIG. 4 is a plan view of an array of the DRAM cells shown in FIG. 1. Each of the wordlines is designated 40-1 through 40-7 and each of the bitlines is designated 60-1 through 60-4. Capacitors are labeled 13-X-Y. The X designates the bitline which is connected through the pass transistor to the capacitor. The Y designates the wordline which controls the conductivity of the transistor connected to the capacitor. Contact points 70 are designated. For example, on memory cell 68 which has capacitor 13-2-4, the signal on wordline 40-4 controls access to the capacitor and the signal on bitline 66-2 is stored on capacitor 13-2-4 when a high voltage signal is placed on wordline 40-4.

Because of the structure of capacitor 13-2-4, wordline 40-4 is not critically aligned to capacitor 13-2-4. Because the moat region is allowed to extend up onto capacitor 13-2-4 and because storage diffusion 22 provides a source/drain region if wordline 40-4 extends onto capacitor 13-2-4, no alignment tolerance is required between capacitor 13-2-4 and wordline 40-4. However, because it is desirable to have the operation of the lightly doped drain between capacitor 13-2-4 and wordline 40-4, a spacing of approximately 0.1 micron for the thickness of storage diffusion 22 and an additional thickness of 2 alignment tolerances (approximately 0.1 micron) is patterned between capacitor 13-2-4 and wordline 40-4.

Although FIG. 4 shows capacitors 13-X-Y as square openings, it has been determined that it is best to provide rounded contours for the openings for the capacitors. With rounded corners, intracapacitor high electric fields can be avoided and closer spacing between capacitors 13-X-Y may be utilized successfully. In addition, an additional implant of boron ions along with the angled ion implantation shown in FIG. 3B provides an envelope of heavily doped P type region around storage diffusion 22. This provides an even greater margin of leakage prevention and allows even denser packing between capacitor 13-X-Y. Previous common knowledge had indicated that the minimum spacing between diffused storage node trench capacitors was about 1 micron. This was caused by the track-off between high substrate doping to prevent leakage and low substrate doping for high breakdown voltage level. Computer synthesis has shown that a density as close as 0.5 microns may be utilized with the field plate scheme as shown in this embodiment. The layout of FIG. 4 provides a minimum spacing between capacitors of approximately 0.8 microns. Given alignment. Given alignment tolerances and 0.6 micron lithography techniques, a minimum spacing of 0.6 microns would then be achieved. Data indicates that this would be acceptable and a cell size of 1.5×2.6 microns may be achieved.

Although the structure of FIG. 1 uses a trench capacitor cell, the field plate structure shown in FIG. 1 may successfully be utilized with the planar cell as shown in FIG. 5. Field plate 128 corresponds to field plate 28 shown in FIG. 1. Rather than depositing polycrystalline silicon into a trench, field plate 128 is formed on the surface of substrate 110 over storage diffusions 122 which are formed by patterned ion implantation. The remaining structures shown in FIG. 5 correspond to the numerically indicated structures with the addition of 100 shown in FIG. 1 and are formed using the same techniques. Thus, the self-aligned features of the bitline contact and the moat region to the field plate region are achieved using a planar capacitor.

FIG. 6 is an electrical schematic diagram showing the electrical operation of the memory cell shown in FIG. 5.

FIG. 7 shows the plan view of selected structures of the memory cell of FIG. 5 which correspond to the layout structure of FIG. 3I. Thus, the self-aligned structure in manufacturing techniques are not limited to the use of trench capacitors and may be successfully used with other storage capacitor techniques and other circuit structures. For example, a stacked capacitor structure may be formed extending from the source region adjacent to capacitor 122 onto the surface of wordline 140 and field plate 128.

FIG. 8 is a side view schematic diagram of another embodiment of the present invention including a poly to poly capacitor 213. Wordline 260 controls conduction between source/drains 268 thus comprising transfer transistor 211. Source/drain 268 and contact diffusion 248 are both N-type diffusions thus comprising a conductive unit. When data is applied via bitline 272 through transfer transistor 211 to contact point 248, current passes through polycrystalline silicon plug 246 to storage plate 228. Storage plate 228 forms the capacitor between storage plate 228 and field plate 238 across dielectric 232.

FIG. 9 is an electrical schematic diagram showing the electrical operation of the DRAM cell shown in FIG. 8. Corresponding reference numbers in FIG. 9 correspond to the components shown in FIG. 8.

FIG. 10A through 10Q are schematic diagrams showing the processing steps for fabricating the memory cell shown in FIG. 8. Substrate 210 is a crystalline silicon substrate doped to P-type to a conductivity of approximately 0.9 ohm centimeters. Silicon dioxide layer 212 is formed on the surface of substrate 210 by thermal oxidation in an oxygen ambient at a temperature of approximately 950° C. for approximately 50 minutes to provide a silicon dioxide layer of approximately 350 Angstroms. Silicon nitride layer 214 is formed by low pressure chemical vapor deposition to a thickness of approximately 1300 Angstroms. Silicon dioxide layer 216 is silicon dioxide deposited using chemical vapor deposition to a thickness of approximately 5000 Angstroms and hardened to provide a hardmask for etching of trenches 218 and 220 were indicated in FIG. 10A. A photoresist pattern (not shown) is then formed on the surface of silicon dioxide layer 216 and used to etch silicon dioxide layer 216, silicon nitride layer 214 and silicon dioxide layer 212 to provide openings 218 and 220 as shown in FIG. 10A.

Figure 10B:
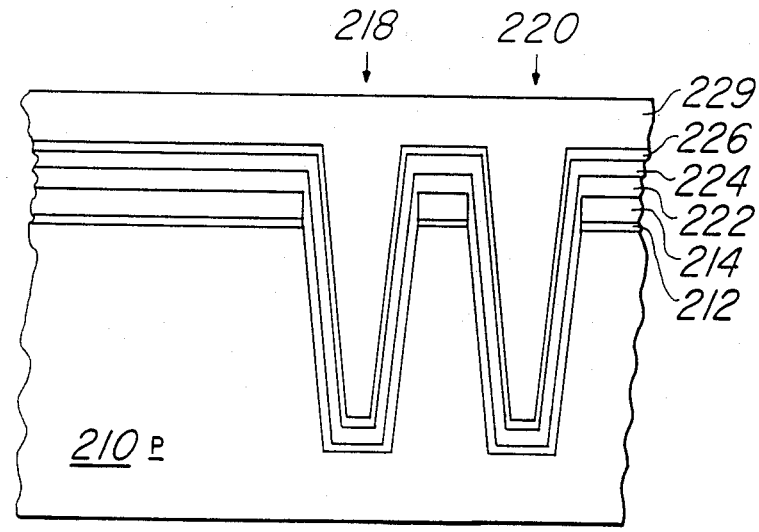
Figure 10C:
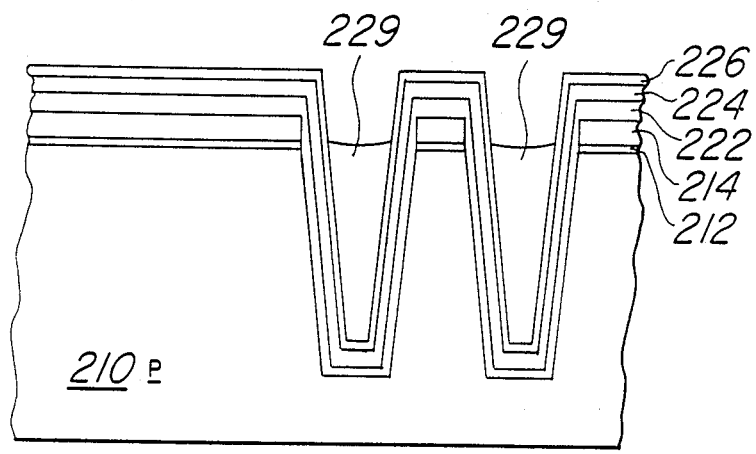

Trenches 218 and 220 are formed in substrate 210 using the etching techniques described in Douglas, et al., supra. A thin silicon dioxide layer is then formed on the walls of trenches 218 and 220 using thermal oxidation in a steam ambient at approximately 900° C. for approximately 10 minutes to a thickness of 250 Angstroms. A layer of silicon dioxide is then deposited in silane to a thickness of approximately 750 Angstroms on the surface of the silicon dioxide layer to provide composite silicon dioxide layer 222 as shown in FIG. 10B. A layer of in situ doped polycrystalline silicon 224 is then deposited using chemical vapor deposition to a thickness of approximately 1000 Angstroms. A layer of TEOS silicon dioxide 226 is then deposited using chemical vapor deposition to a thickness of approximately 500 Angstroms. layer of photoresist 228 is then deposited to a thickness of approximately 10,000 Angstroms to provide the structure shown in FIG. 10B. Photoresist layer 228 is then 573 posed to light overall,without the use of a mask. The wavelength, intensity and time of exposure are chosen so that the top layer of photoresist layer 228 is exposed while the portion of photoresist layer 228 in trenches 218 and 220 is unexposed. The exposed photoresist is then removed using common developing techniques to leave the remainder of photoresist layer 228 as shown in FIG. 10C.

Figure 10D:
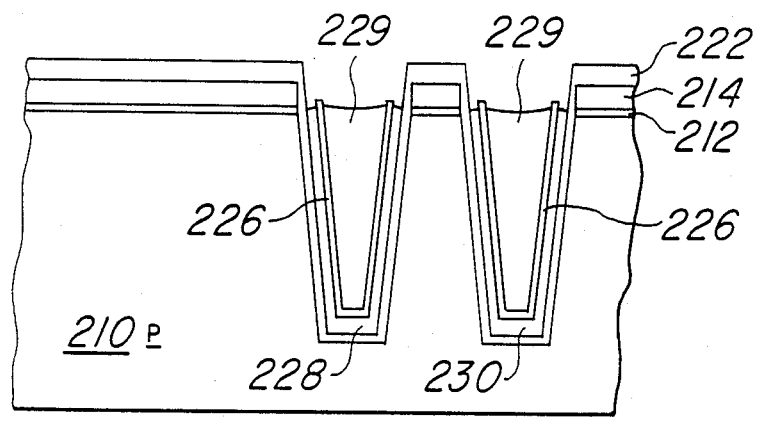
Figure 10E:
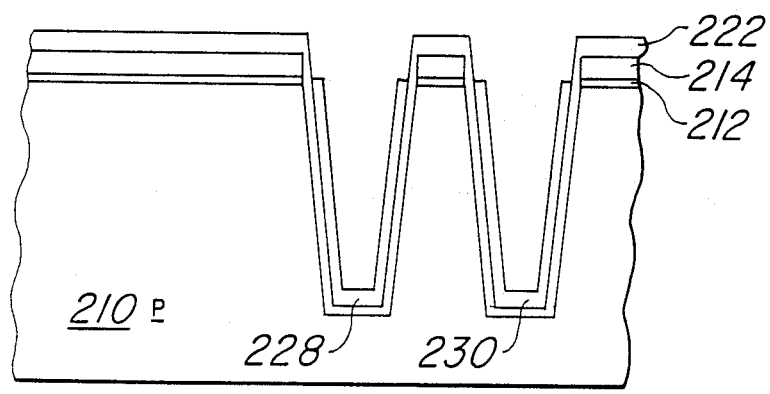
Figure 10F:
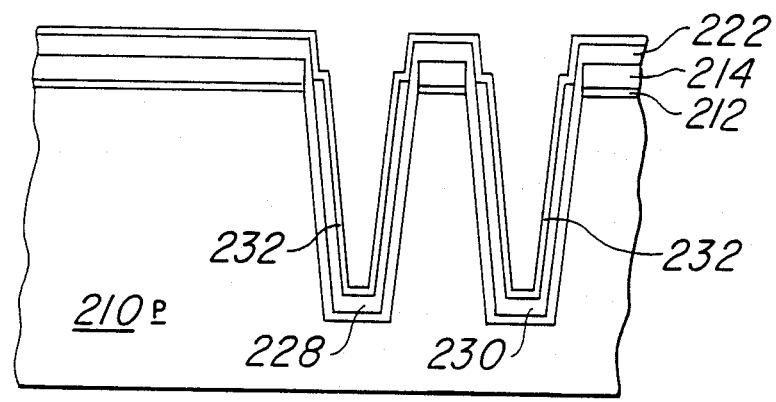
Figure 10G:
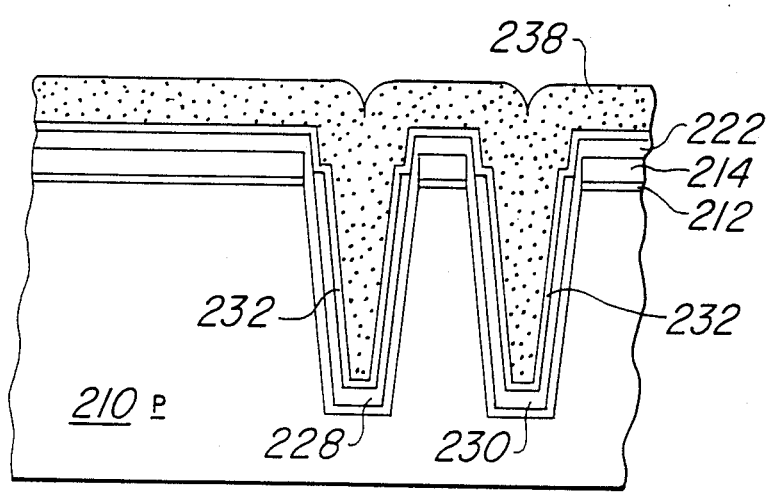

Silicon dioxide layer 226 is then etched using $C_2F_6$/$CHF_3$ plasma. Polycrystalline silicon layer 224 is then etched using $3F_6$ plasma. The remaining portions of polycrystalline silicon layer 224 form polycrystalline silicon plate 228 and polycrystalline silicon plate 230 as shown in FIG. 10D. The remainder of photoresist 229 and silicon dioxide layer 226 are then removed using wet chemical etching techniques leaving the structure of FIG. 10E. A layer of silicon nitride is then deposited using low chemical vapor deposition to provide silicon nitride layer 232 as shown in FIG. 10F. A layer of polycrystalline silicon is then deposited having a thickness of approximately 6000 Angstroms to completely fill trenches 218 and 220 as shown in FIG. 10G. Polycrystalline silicon layer 238 will form field plate 238 after etching as described with regard to FIG. 10H.

Figure 10H:
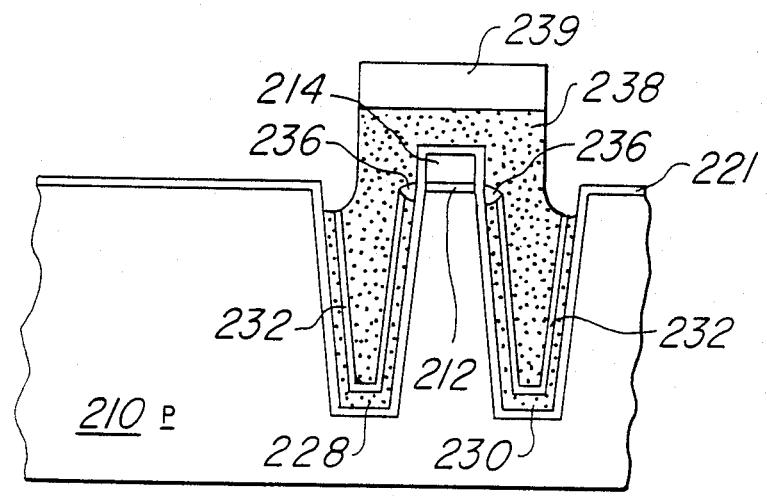

A layer of photoresist 239 is then deposited and patterned on the surface of polycrystalline silicon layer 238 as shown in FIG. 10H. Polycrystalline silicon layer 238 is then etched using a combination anisotropic and isotropic etch to provide sloped sidewalls and thus to provide the structure shown in FIG. 10H. Silicon nitride layer 232, silicon dioxide layer 222 and silicon nitride layer 214 are then removed using anisotropic etching techniques such as reactive ion etching in $C_2F_6$/$CHF_3$ plasma. Thus the structure of FIG. 10H remains.

Figure 10I:
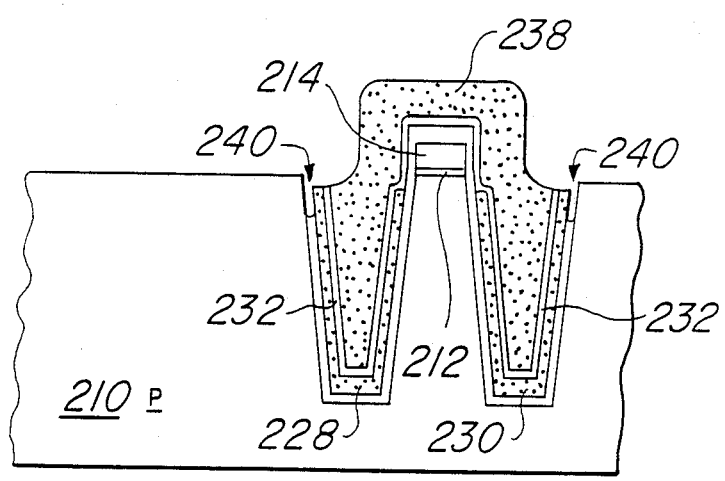

The structure of FIG. 10H is then subjected to an isotropic silicon dioxide etch such as wet chemical etching in hydrofluoric acid to remove the top portion of silicon dioxide layer 221 and to remove a portion of the silicon dioxide layer 221 between substrate 210 and plates 228 and 230 to provide openings 240 as shown in FIG. 10I. Photoresist layer 239 is then removed using common photoresist removal techniques.

Figure 10J:
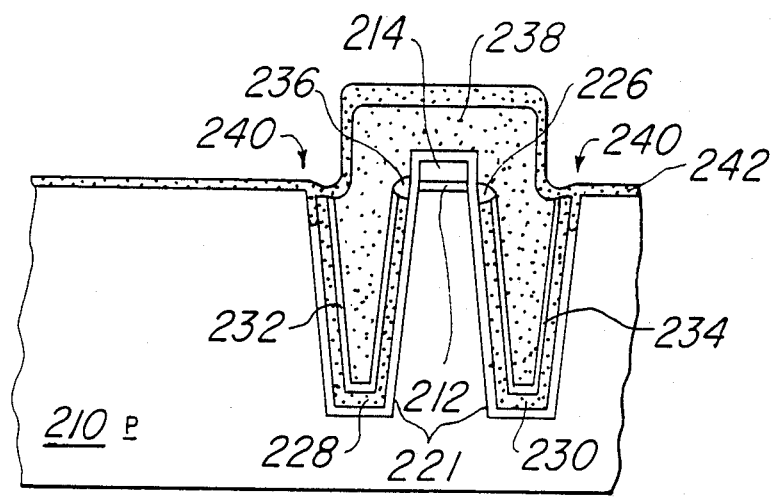

A layer of polycrystalline silicon 242 is then deposited on the structure of FIG. 10I to provide a thin polycrystalline silicon layer over-all and to fill openings 240 as shown in FIG. 10J. The structure of FIG. 10J is then subjected to an isotropic etch such as carbon tetraflouride plasma to remove the top portion of polycrystalline silicon layer 242.

Figure 10K:
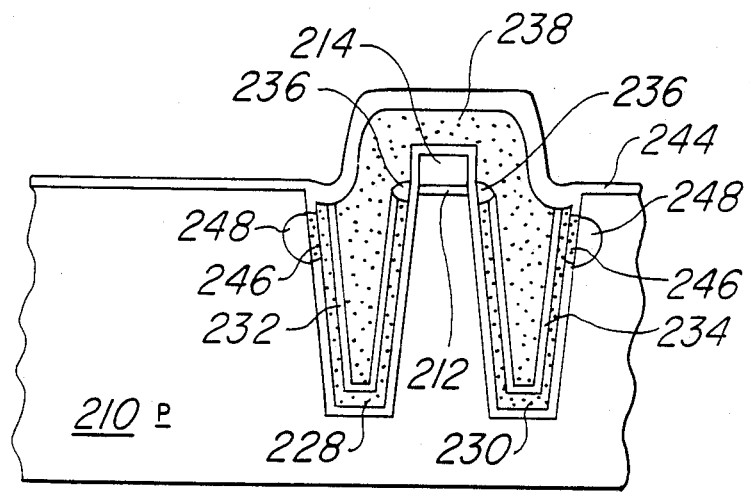

A portion of polycrystalline silicon layer 242 in openings 240 will remain to form polycrystalline silicon plugs 246 as shown in FIG. 10K. Dopant atoms will diffuse from storage plates 228 and 230 to form diffusions 248. This technique for forming the contacts from diffusions 248 to plates 228 and 230 is shown in copending application Ser. No. 122,604, which is assigned to the assignee of this appliction and which is hereby incorporated by reference. The resulting structure is then thermally oxidized to form silicon dioxide layer 244 as shown in FIG. 10K. In an alternative embodiment, silicon nitride layer 214 and silicon dioxide layer 212 remain at this step and are used as an oxidation mask to protect the moat region while polycrystalline silicon layer 238 is oxidized. Silicon nitride layer 214 and silicon dioxide layer 212 are then removed, and a second thermal oxidation step is used to form the portion of silicon dioxide layer 244 on the moat. This process allows greater control of the relative thickness of the two portions of silicon dioxide layer 244.

Figure 10L:
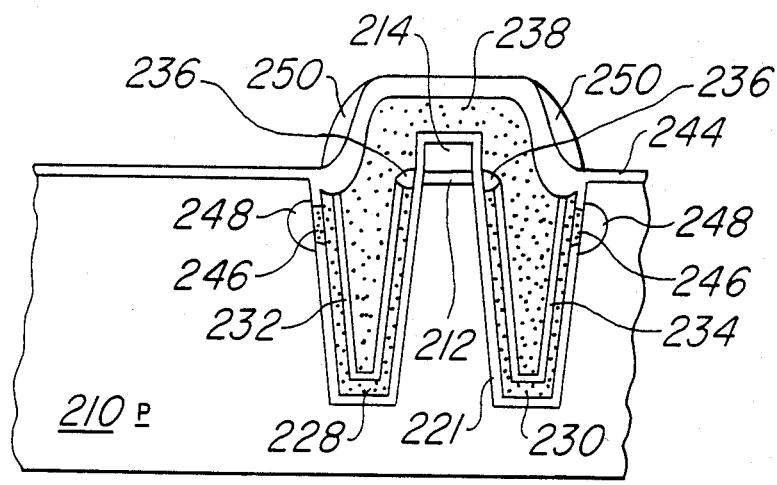
Figure 10M:
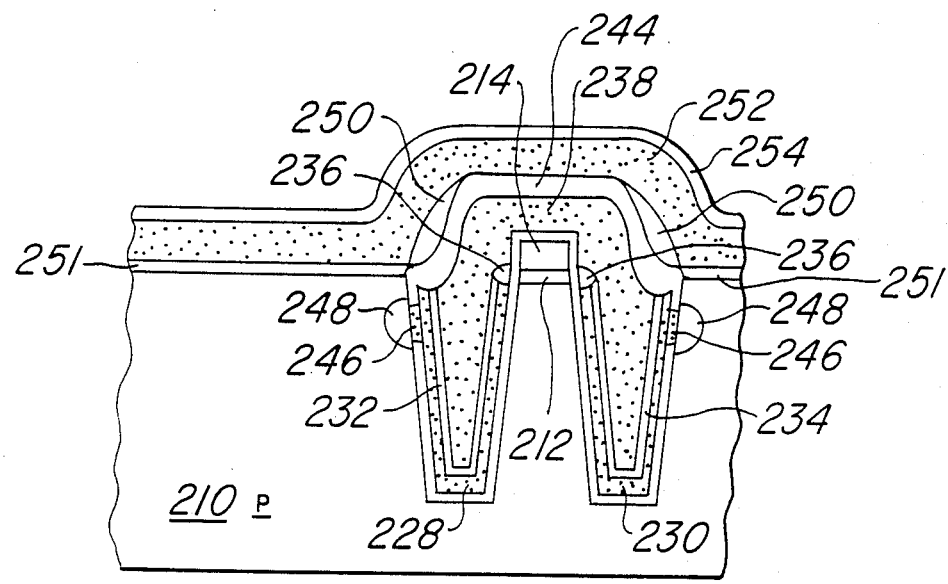

A layer of silicon nitride (not shown) is then formed to a thickness of approximately 1000 Angstroms on the surface of the structure of FIG. 10K and anisotropically etched to provide silicon nitride sidewall layers 250 as shown in FIG. 10L. Silicon nitride sidewall layers 250 provide sealing of the corner of plates 232 and help prevent the formation of conductive filaments on the sides of silicon dioxide layer 244 during subsequent deposition and etching of conductive layers.

A layer of polycrystalline silicon 252 is then formed on the surface of the structure of FIG. 10L to a thickness of approximately 5000 Angstroms. Polycrystalline silicon layer 252 is doped to a conductivity of approximately 0.005 ohm-centimeters by insitu doping. A layer of TEOS silicon dioxide 254 is then formed on the surface of polycrystalline silicon layer 252 to a thickness of approximately 2500 Angstroms. A layer of patterned photoresist (not shown) is then used to etch polycrystalline silicon layer 252 and silicon dioxide layer 254 to provide wordlines 256, 258, 260, 262 and 264 as shown in FIG. 10N.

FIG. 10O is a plan view of the resulting structure showing the moat region as substrate 210. Note that the opening extends onto the surface of the capacitors formed in trenches 218 and 220. This overlap allows for misalignments and allows for optimal spacing of the resulting transistor without the additional alignment spaces between trench 218 and wordline 260, for example. Because no alignment spacing is required between trench 218 and wordline 260, no additional diffusions are required and an absolute minimum spacing may be provide between wordline 260 and trench 218.

Figure 10N:
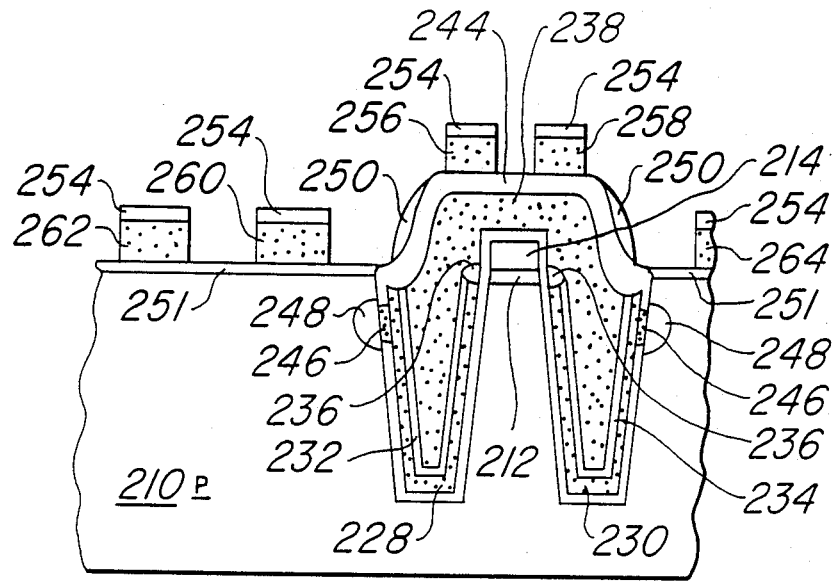
Figure 10:
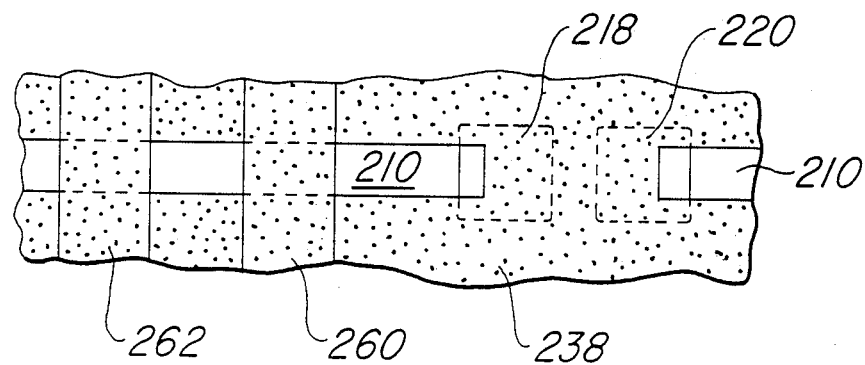
Figure 10:
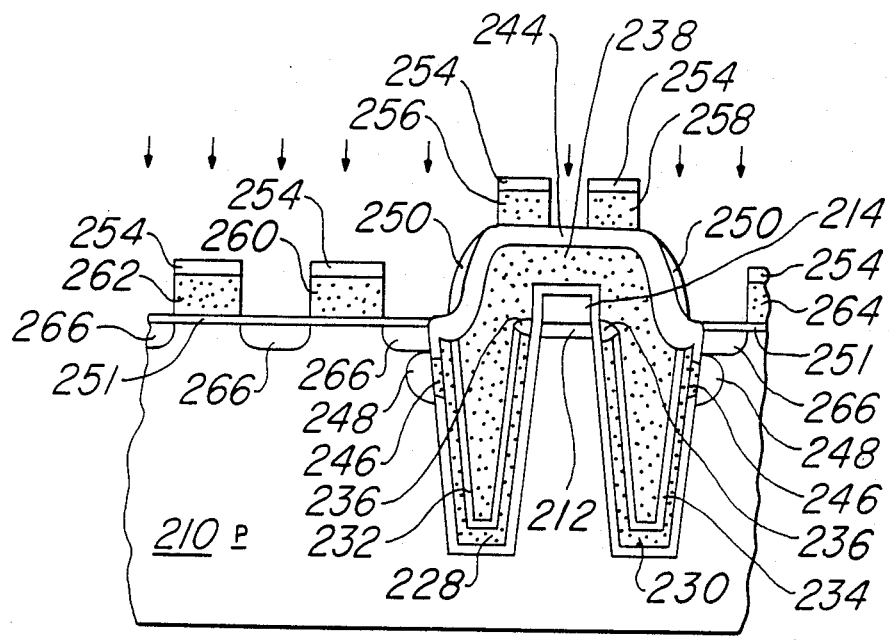
Figure 10:
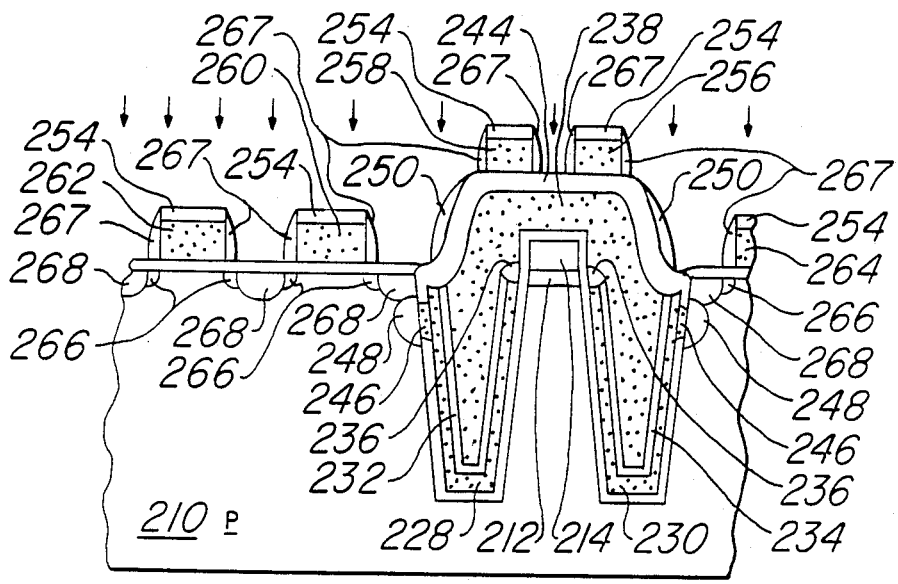

The structure of FIG. 10N is then subjected to an ion implantation of phosphorous or arsenic ions having an energy of approximately 60 kiloelectron volts and a density of approximately $4 \times 10^{13}$ ions per centimeter$^2$. This forms lightly doped source/drain regions 266 as shown in FIG. 10P. A layer of silicon dioxide is then deposited to a thickness of approximately 1500 Angstoms using chemical vapor deposition and is then etched using anisotropic etching to provide silicon dioxide sidewall layers 267 as shown in FIG. 10Q. The structure of FIG. 10Q is then subjected to an ion implantation of arsenic ions having an energy of approximately 150 kiloelectron volts and a density of approximately $3 \times 10^{15}$ ions per centimeter$^2$. Alternatively, the lightly doped regions 266 may be omitted and a double implantation after the formation of sidewall oxide layers 267 may be used using an arsenic ion implantation of arsenic ions having an energy of approximately 150 kiloelectron volts and a density of approximately $3 \times 10^{15}$ ions per centimeter$^2$ plus a phosphorous ion implantation of phosphorous ions in an energy of approximately 85 kiloelectron volts in a density of approximately $4 \times 10^{14}$ ions per centimeter$^2$. Because of the greater diffusivity of phosphorous atoms in silicon, lightly doped drain regions are formed surrounding source/drain regions 268 thus providing a substitute for lightly doped regions 266 as shown in FIG. 10Q.

Because the moat opening overlapped the capacitor region, source/drain region 268 between wordline 260 and diffused region 248 provides a conductive connection for transistor 211 as shown in FIG. 8. Even with misalignment, a transistor using doped region 248 as a source/drain will be formed thus providing a functioning pass transistor. This structure allows for misalignment and thus alignment tolerances may be omitted between wordline 216 and capacitor 213.

A layer of boron phosphorous silicon dioxide is then deposited to a thickness of approximately 2000 Angstroms. This layer remains in the undensified state and a resist pattern (not shown) is formed on the surface of silicon dioxide layer 270. Silicon dioxide layer 270 is then etched in a solution of 10% hydroflouric acid for approximately 15 seconds. A quick reactive ion etch using carbon tetraflouride is used to remove silicon dioxide layer 251 above source/drain diffusion 268. A layer of polycrystalline silicon 272 is then deposited to a thickness of approximately 3500 Angstroms and doped in situ to provide a conductivity of approximately 40 ohms per centimeter$^2$. Because TEOS silicon dioxide layers 234 and sidewall silicon dioxide layers 267 are resistant to the 10% hydrofluoric acid etch, the contact of polycrystalline silicon layer 272 is aligned to wordlines 262 and 260 and is automatically self-aligned. Thus, no alignment tolerance is required for the formation of the bitline contact 271 to source/drain diffusion 268. Because no alignment tolerances are required, a denser array may be formed.

FIG. 11 is a plan view of a memory array using the memory cell of FIG. 8. The layout of FIG. 11 is similar to that of FIG. 9 and because of the use of similar self-aligning techniques and overlap between the moat region and the capacitor region, similar layout providing optimal density is provided. Therefore, memory cell 274 as shown in FIG. 11 may be formed having an area of 1.5 microns $\times$ 2.6 microns using 0.6 micron rules with 0.1 micron alignment tolerances.

Although specific embodiments of the present invention are herein described, they are not to be construed as limiting the scope of the present invention. Other embodiments will become clear to those skilled in the art in light of the teachings of this specification. Fo example, although the embodiments show the use of crystalline silicon, other semiconductor materials such as gallium arsenide may be used. In addition, although the manufacturing techniques used herein are described with regard to the fabrication of DRAM cells, the techniques used herein may have wide applicability in other integrated circuit structures. For example, formation of self-aligned transistors to field plate isolation systems may have wide applicability in other device structures. The present invention is only limited by the claims appended hereto.

What is claimed is:

1. A process for forming a DRAM cell, comprising the steps of:
    forming a trench in a substrate;
    forming a first insulating layer on the surfase of said trench;
    forming a first conductive layer on said first insulating layer;
    forming a second insulating layer on said first conductive layer;
    forming a second conductive layer on said second insulating layer;
    removing a portion of said first insulating layer between said substrate and said first conductive layer to provide a cavity;
    filling said cavity with a conductive material; and
    forming a transistor on the surface of said substrate, adjacent to said trench, one source/drain of said transistor being conductively connected to said conductive material.

2. A process as in claim 1 wherein said conductive connection to said one source/drain is in part formed by diffusing dopant atoms from said first conductive layer, through said conductive material, into said substrate, thereby forming a diffused region in said substrate.

3. A process as in claim 1 wherein said second conductive layer is conductively connected to a reference potential.

4. A process as in claim 1 wherein said first and second insulating layers are selected ones or combinations of a group of materials consisting of silicon dioxide, silicon nitride and tantulum oxide.

5. A process as in claim 1 wherein said first and second conductive layers are selected ones or combinations of a group of materials consisting of polycrystalline silicon, tungsten and titanium.

* * * * *